(12) United States Patent
Gilmore et al.

(10) Patent No.: US 7,977,915 B2
(45) Date of Patent: Jul. 12, 2011

(54) METHOD AND SYSTEM FOR POWER MANAGEMENT

(75) Inventors: Peter B. Gilmore, Plantation, FL (US); Edwin L. Bradley, Coral Springs, FL (US); Charles E. Kline, Plantation, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 896 days.

(21) Appl. No.: 11/945,632

(22) Filed: Nov. 27, 2007

(65) Prior Publication Data
US 2009/0134841 A1    May 28, 2009

(51) Int. Cl.
*H02J 7/00* (2006.01)
*H02J 9/00* (2006.01)
(52) U.S. Cl. ........ 320/118; 320/119; 320/124; 320/127; 307/66
(58) Field of Classification Search ................. 320/118
See application file for complete search history.

(56) References Cited

U.S. PATENT DOCUMENTS

| | | | |
|---|---|---|---|
| 5,698,967 A * | 12/1997 | Baer et al. | 320/152 |
| 5,701,068 A * | 12/1997 | Baer et al. | 320/119 |
| 6,133,712 A * | 10/2000 | Yeon | 320/145 |
| 6,304,059 B1 * | 10/2001 | Chalasani et al. | 320/118 |
| 6,771,044 B1 * | 8/2004 | Vinciguerra et al. | 320/116 |

OTHER PUBLICATIONS

"Smart Battery Management Applications", Actel Application Brief, Dec. 2005, pp. 1-4.

* cited by examiner

*Primary Examiner* — Edward Tso
*Assistant Examiner* — Yalkew Fantu (57) ABSTRACT

A method for managing power of a power source and a system is disclosed. The method includes determining (404) a power source capacity value for the power source having a plurality of cells. Further, the method includes determining (406) a cell-capacity value for each cell of the plurality of cells. Furthermore, the method includes determining (408) a duty-cycle ratio value for each cell of the plurality of cells according to the determined cell-capacity value of the cell and the power source capacity value. Moreover, the method includes drawing (410) power from each cell of the plurality of cells according to the determined duty-cycle ratio value of the cell to achieve the power source capacity value for the power source.

15 Claims, 4 Drawing Sheets

METHOD AND SYSTEM FOR POWER MANAGEMENT

FIELD OF THE INVENTION

The present invention relates generally to the field of power management systems, and more specifically, to a method and system for managing power of a power source used in electronic devices.

BACKGROUND

With the advent of portable electronic devices, there has been a multifold growth in the usage of power sources used in these devices. Typically, these power sources come in the form of battery packs. The portable electronic devices use these battery packs as a source of power for driving various electronic circuits used in these devices. Further, once these battery packs get discharged after usage, they can be recharged by using a power source and appropriate charging circuits. However, for the convenience of users of portable devices, it is desired that a battery pack should supply power to a portable device for the maximum possible time duration. For example, once charged, battery packs in mobile phones can be used up to durations of 16-18 hours, depending on the usage of the mobile phone. Further, portable electronic devices have shape and size restrictions. Consequently, it is desired that the battery packs make optimal use of the available space in the portable devices.

Different types of portable electronic devices where these battery packs are used have different size restrictions and power requirements. For example, a battery pack used in a mobile phone will have different size and power restrictions from a battery used in a laptop. However, manufacturing and shipping of different types of battery packs for different portable devices add to the overall cost of these electronic devices. Consequently, to reduce the cost of shipping, the portable electronic devices are shipped without a battery pack. After receiving these devices at a location, these devices are connected to battery packs that are assembled locally by using locally available battery cells. Battery packs can be assembled by connecting one or more battery cells of equal or unequal capacity in series and/or parallel connection.

Further, battery cells having unequal power capacities vary in shapes and sizes. As a result, while assembling a battery packs by using locally available battery cells, care should be taken that the battery cells are selected such that they meet the power requirements and size restrictions of the portable electronic device. Also, in case battery cells of different capacities are used in a battery pack, it should be ensured that all the battery cells in the battery pack discharge at the same rate.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate the embodiments and explain various principles and advantages, in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to power management in electronic devices. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, and the like may be used solely to distinguish one entity or action from another entity or action without necessarily requiring or implying any actual such relationship or order between such entities or actions. The terms 'comprises,' 'comprising,' or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by 'comprises . . . a' does not, without more constraints, preclude the existence of additional identical elements in the process, method, article, or apparatus that comprises the element.

For one embodiment of the present invention, a method for managing power of a power source is provided. The method includes determining a power source capacity value for the power source having a plurality of cells. Further, the method includes determining a cell-capacity value for each cell of the plurality of cells. Furthermore, the method includes determining a duty-cycle ratio value for each cell of the plurality of cells according to the determined cell-capacity value of the cell and the power source capacity value. Moreover, the method includes drawing power from each cell of the plurality of cells according to the determined duty-cycle ratio value of the cell to achieve the power source capacity value for the power source.

For another embodiment of the present invention, a system is provided. The system includes a power source having a plurality of cells and providing power at a power source capacity value. Further, the system includes a sensing module for determining a cell-capacity value for each of the plurality of cells. Furthermore, the system includes a processor for determining a duty-cycle ratio value for each cell of the plurality of cells according to the determined cell-capacity value of the cell and the power source capacity value. Moreover, the system includes a controller for drawing power from each cell of the plurality of cells according to the determined duty-cycle ratio value of the cell to achieve the power source capacity value for the power source.

Figure 1:
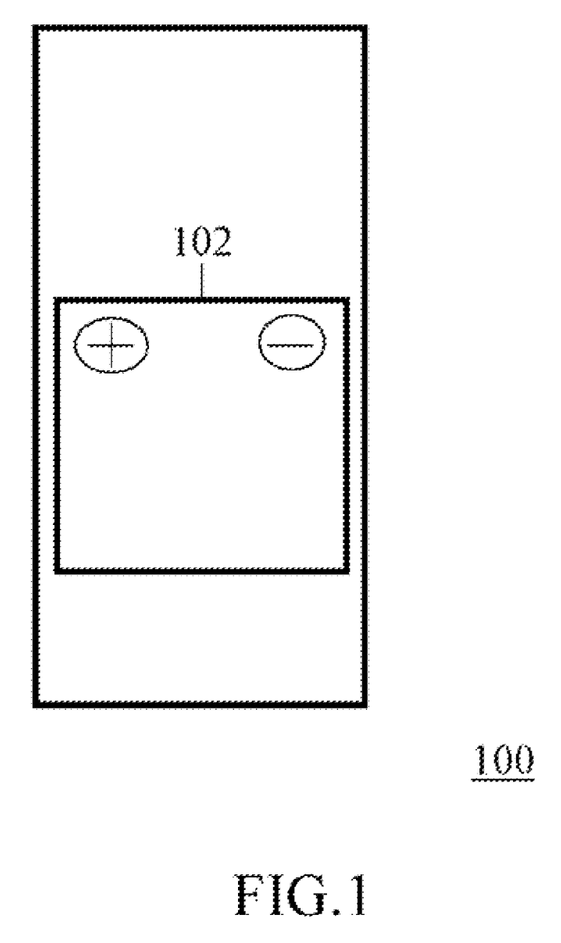
FIG. 1 illustrates an exemplary electronic device, where various embodiments of the present invention can be practiced.

FIG. 1 illustrates an exemplary electronic device 100, where various embodiments of the present invention can be practiced. Examples of the electronic device 100 include, but are not limited to mobile phones, laptops, Personal Digital Assistants (PDAs), cordless phones, and cameras. The electronic device 100 includes a power source 102. For one embodiment, the power source 102 can be a battery pack. The power source 102 can be made up of one or more battery cells. The battery cells can be, for example, rechargeable Lithium ion, Nickel or Cadmium batteries known in the art. The power source 102 can be used for driving various electronic circuits in electronic device 100. Further, the one or more cells which make up the power source 102 are selected based on power requirements and size restrictions of the electronic device 100.

One of the power requirements of the electronic device 100 can be, for example, to draw current from the power source 102 for the maximum possible time. In order to meet this requirement, one or more cells that make up the power source 102 can be connected in parallel with each other. For another embodiment, the electronic device 100 may require a high voltage supply from the power source 102 to the electronic circuitry of the device. To meet this requirement, the cells can be connected in series with each other. Further, the cells which are connected together in series and/or parallel connection can be of equal or unequal capacities. Also, cells of different capacities can have different shapes and sizes. Based on the above, while selecting cells to make up the power source 102, the size and shape restrictions and power requirements of the electronic device 100 are taken into consideration.

Figure 2:
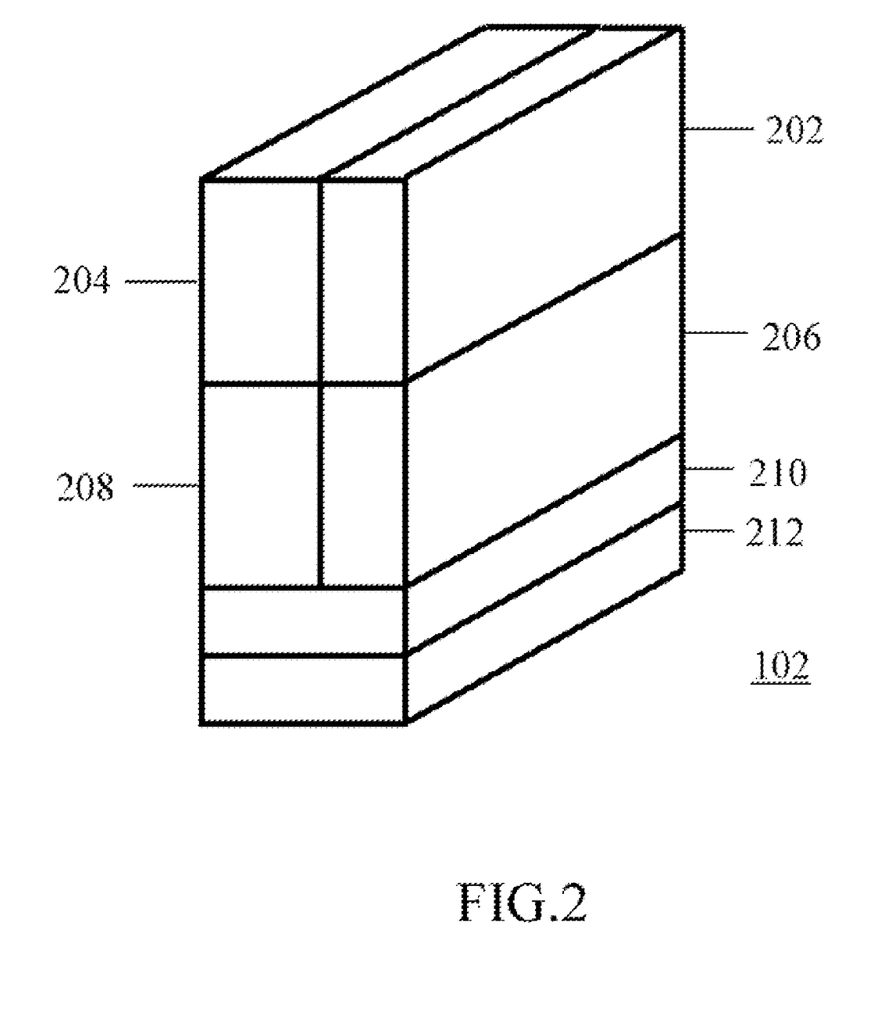
FIG. 2 is a block diagram illustrating an exemplary power source, in accordance with some embodiments of the present invention.

FIG. 2 illustrates the power source 102, in accordance with various embodiments of the present invention. The power source 102 can include a plurality of cells. Further, the plurality of cells can be connected in series and/or parallel based on power requirements of the power source 102. Moreover, the plurality of cells can be of equal and/or unequal capacities based on shape and size requirements of the power source 102. For one embodiment, the power source 102 can include a cell 202, a cell 204, a cell 206, a cell 208, a cell 210, and a cell 212. For example, desired capacity of the power source 102 can be 7.2 Volts at 2100 milli Ampere Hour (mAH). Further, the cells 204 and 208 can be of equal capacity, for example, 800 mAH. The cells 202 and 206 can be of equal capacity, for example, 700 mAH. The cells 210 and 212 can be of equal capacity, for example, 600 mAH.

To achieve the total output power capacity of power source 102, the cells of the power source can be connected in series. As shown in FIG. 2, the cell 204 can be connected in series with the cell 208. Similarly, the cell 202 can be connected in series with the cell 206. The cell 210 can be connected in series with the cell 212. Further, to ensure that power can be drawn from the power source 102 for a longer duration, the cells of the power source can be connected in parallel. For instance, a combination of the series connected cells 204 and 208 can be connected in parallel with the combination of the series connected cells 202 and 206. Also, a parallel connection of the series connected cells 204 and 208; and the series connected cells 202 and 206 can be connected in parallel with the series combination of the cells 210 and 212. For one embodiment, the cells 202, 204, 206, 208, 210 and 212 connected in the way described above forms the power source 102. Further, it will be apparent to a person ordinarily skilled in the art that the above stated combination of cells has been described as an example and the power source 102 can include more or less number of cells than stated above. Further, the power source 102 can include cells with different power capacities than those stated above. Furthermore, the cells can be inter-connected in a different way than described above.

Figure 3:
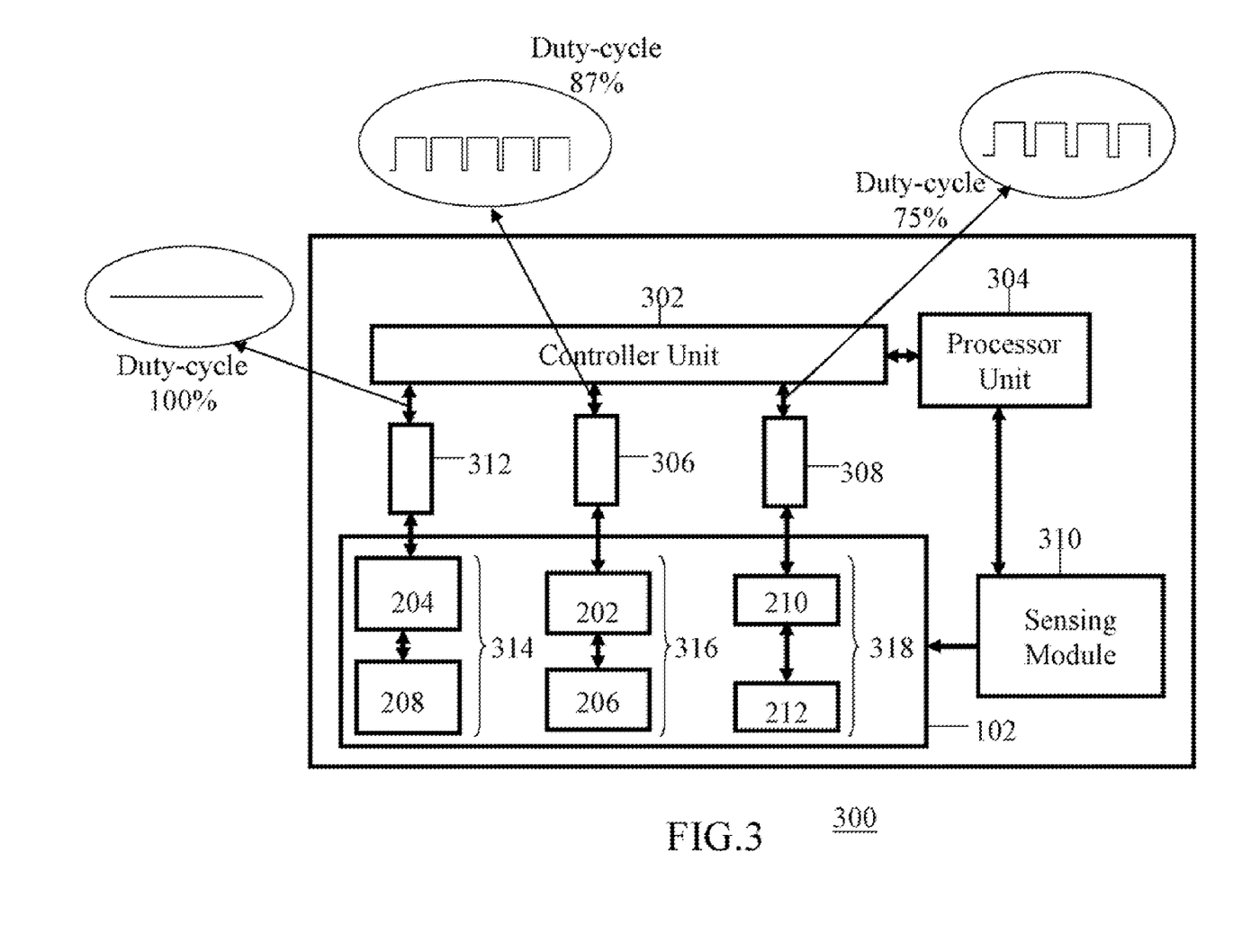
FIG. 3 is a block diagram of an exemplary power management system, in accordance with some embodiments of the present invention.

FIG. 3 is a block diagram of an exemplary power management system 300, in accordance with some embodiments of the present invention. The power management system 300 can include the power source 102, a controller unit 302, a processor unit 304, a first switch 306, a second switch 308, and a sensing module 310. For some embodiments, the power management system 300 can also include a third switch 312. The switches 306, 308 and 312 can be selected from the group comprising a Field Effect Transistor (FET), a flip-flop, a Metal Oxide Semiconductor FET (MOSFET), a Bipolar Junction Transistor (BJT), an N-Channel Metal Oxide Semiconductor FET (N-MOSFET), a P-Channel Metal Oxide Semiconductor FET (P-MOSFET), a Complimentary Metal Oxide Semiconductor FET (C-MOSFET), an electrical switch, a mechanical switch, an electromechanical switch, and a relay.

As explained in FIG. 2, the power source 102 includes the cells 202, 204, 206, 208, 210 and 212. Each cell can provide an output power at a cell-capacity value. For example, the cells 204 and 208 can have a cell-capacity value of 800 mAH. The cells 202 and 206 can have a cell-capacity value of 700 mAH. The cells 210 and 212 can have a cell-capacity value of 600 mAH. Further, the series connected cells 204 and 208 can form a cell-pack 314. The series connected cells 202 and 206 can form a cell-pack 316. Similarly, the series connected cells 210 and 212 can form a cell-pack 318. Based on the cell-capacity values of the cells that make up the power source 102, the power source 102 can provide an output power at a power source capacity value. For example, the power source 102 can output power at a power source capacity value of 7.2 Volts at 2100 mAH. The power management system 300 can be configured to manage power drawn from the power source 102 so that the cells 202, 204, 206, 208, 210 and 212 discharge at equal rate.

The sensing module 310 can determine a power capacity of the power source 102 as well as power capacity of each of the cells and combination of series connected cells in the power source 102. For some embodiments, the power capacity of the power source 102 and the cells in the power source 102 can be determined by a manufacturer of a power source and cells. For such cases, the power management system 300 may not include the sensing module 310.

The power capacities can be determined based on, for example, one or more parameters such as current, voltage, impedance, conductance, temperature and power. After determining the power capacities, the sensing module 310 can transmit the power capacity values to the processor unit 304. The processor unit 304 can store the power capacity values in a memory. In case the power capacities are determined by a manufacturer of the cells, the power capacity values can be pre-stored at the processor 304. The processor unit 304 can be, for example, an Application Specific Integrated Circuit (ASIC), a microprocessor, a microcontroller, or a software module. Further, the processor unit 304 can calculate a duty-cycle ratio value corresponding to each of the cell-packs 314, 316 and 318 and cells 202-212. Typically, duty-cycle ratio can be defined as a ratio of 'active' time to the 'total' time of an operating clock cycle for an electrical parameter. Duty-cycle can be represented in terms of ratio or percentage. For example, a duty-cycle of 40% for a voltage signal 10 Volts (V) can imply that in a cycle of 100 seconds, the signal can have a value of 10 V for 40 seconds and value of 0 V for the remaining 60 seconds.

Based on the duty-cycle ratio values determined by the processor 304, the controller unit 302 can control the power drawn from each of the cell-packs 314, 316 and 318. The controller unit 302 controls the switching of the first switch 306, the second switch 308, and the third switch 312 to provide at least one of a charging and discharging path for the cell-packs 314, 316 and 318 and cells 202-212. For example, a positive terminal of an output voltage of the power source 102 of the power management system 300 can be connected to the controller unit 302. Further, the corresponding earth for the power source 102 can be connected to the cell-packs 314, 316 and 318. Based on the inputs from the controller unit 302, the first switch 306, second switch 308 and third switch 312 can be switched 'on' or 'off' for providing the required charging and discharging paths for the cell-packs 314, 316 and 318. The controller unit 302 can be configured for controlling a pulse-waveform corresponding to each of the plurality of cells or the cell-packs. Further, the pulse-waveform can be based on the duty-cycle ratio value of a cell or a cell-pack. As illustrated in FIG. 3, the third switch 312 can be switched to the 'on' mode to provide a continuous discharging path for the cell-pack 314. Similarly, the first and the second switches 306 and 308 can be switched to 'on' and 'off' modes at different rates to provide appropriate charging and discharging paths to the cell-packs 316 and 318.

Figure 4:
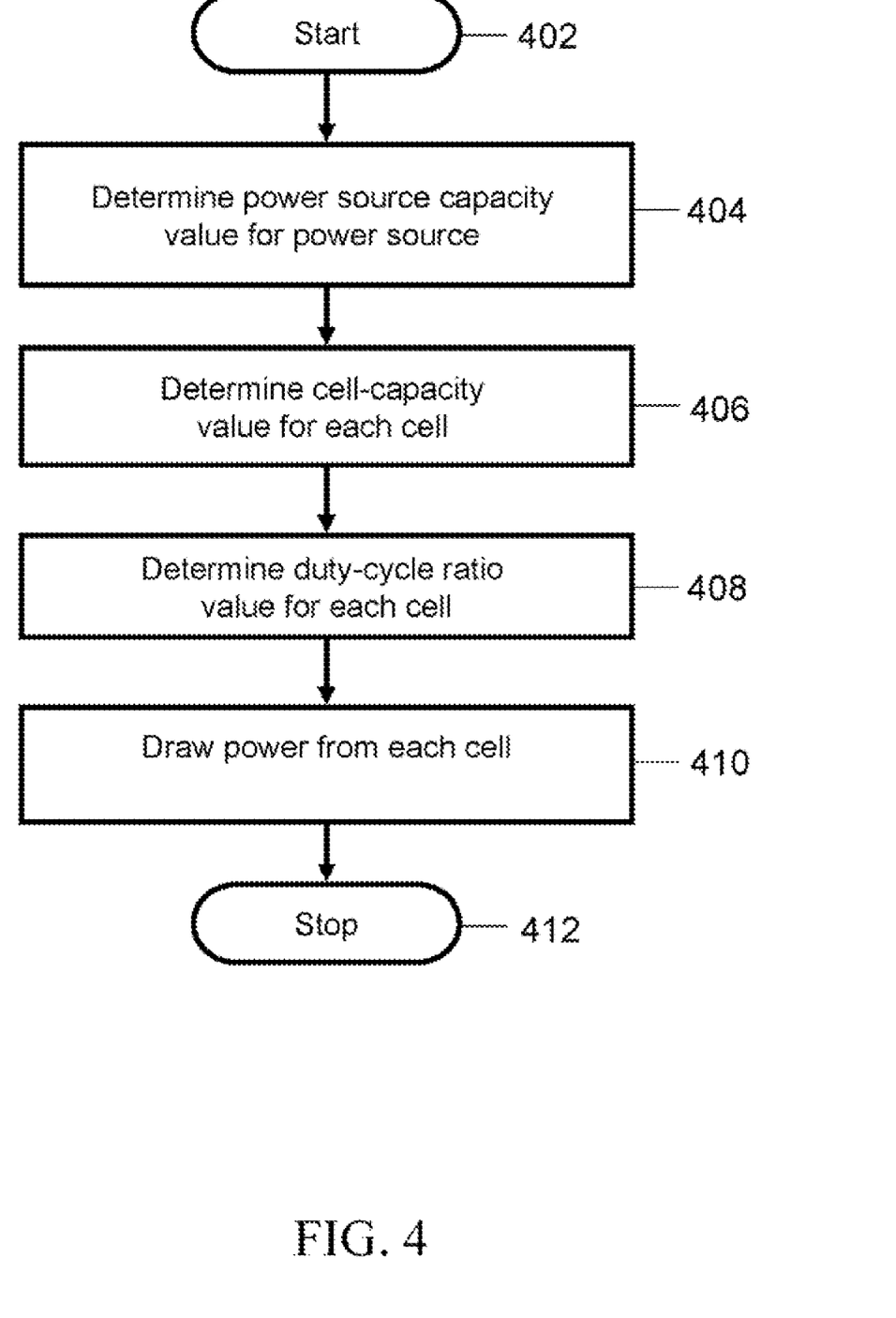
FIG. 4 is a flow diagram illustrating a method for managing power in an electronic device, in accordance with an embodiment of the present invention.

FIG. 4 is a flow diagram illustrating a method for managing power in an electronic device, in accordance with various embodiments of the present invention. The method for managing power in an electronic device including a power source 102 is initiated at step 402. At step 404, a power source capacity value can be determined for the power source 102. For one embodiment, for determining the power source capacity value, the sensing module 310 can sense the power capacity of the power source 102. The sensed power source capacity value can be transmitted to processor unit 304. The processor unit 304 can store the received power source capacity value of power source 102 in a memory.

For one embodiment, the power source 102 can include the cell-packs 314, 316 and 318 and cells 202-212 as shown in FIG. 3. Further, the cell-packs 314, 316 and 318 can be connected in parallel. At step 406, a cell-capacity value can be determined for each cell 202-212 of the plurality of cells of the power source 102. The cell-capacity value can be determined for each of the cell-packs 314, 316 and 318. For determining the cell-capacity values, the sensing module 310 can sense the power capacity of each of the cell-packs 314, 316 and 318, and transmit the cell-capacity values to the processor unit 304. Further, the processor unit 304 stores the received cell-capacity values in the memory. The power source capacity value and the cell-capacity values can be determined by using parameters such as a current parameter, a voltage parameter, a temperature parameter, an impedance parameter, a conductance parameter and a power parameter.

At step 406, a duty-cycle ratio value is determined for each cell of the plurality of cells in the power source. The duty-cycle ratio value can be determined for, for example, each of the cell-packs 314, 316 and 318 and cells 202-212. Further, the duty-cycle ratio value can be determined according to the determined cell-capacity values for the cell-packs and the power source capacity value. For one embodiment, the duty-cycle ratio value for a cell can be a function of the cell-capacity value of the corresponding combination of series connected cells in a cell-pack to the power source capacity value of the power source. The processor unit 304 can calculate the duty-cycle ratio value for a cell-pack based on the ratio of the cell-capacity value of the cell-pack and the power source capacity value of the power source. The duty-cycle ratio value is calculated such that each cell-pack dissipates at an equal rate. For instance, if the power source capacity value of the power source 102 is 7.2 Volts at 800 mAH, duty-cycle ratio value for the cell-pack 314 having the combination of series connected cells 204 and 208 can be calculated as (800 mAH÷800 mAH) i.e. the duty cycle ratio value can be one. Similarly, duty-cycle ratio value for the combination of series connected cells 202 and 206 in the cell-pack 316 can be calculated as (700 mAH*800 mAH) i.e. the duty-cycle ratio value can be 0.87. The duty cycle ratio value for the combination of series connected cells 210 and 212 in the cell-pack 318 can be calculated as (600 mAH÷800 mAH) i.e. the duty-cycle ratio value can be 0.75. Based on the duty-cycle ratio value for the cells, the corresponding cell-packs can be pulsed by the controller unit 302. For example, based on the duty-cycle for the cells 204 and 208 (i.e. one), the cell-pack 314 can be pulsed so that power can be drawn continuously for all clock cycles from the cell-pack. Further, the cell-pack 316 can be pulsed such that in a single clock cycle, power is drawn for 87% of the total clock time. Similarly, the cell-pack 318 can be pulsed such that in a single clock cycle, power is drawn for 75% of the total clock time.

At step 410, power can be drawn from each cell 202-212 of the plurality of cells in the cell-packs according to the determined duty-cycle ratio value of the cell to achieve the power source capacity value from the power source. After determining the duty cycle ratio value, the calculated duty-cycle ratio value for each cell-pack can be transmitted from the processor unit 304 to the controller unit 302. For one embodiment, the controller unit 302 provides a continuous discharging path for any cell-pack having the duty-cycle ratio value as one. For example, the controller unit 302 can provide a continuous discharging path to the cell-pack 314. Further, the controller unit 302 switches the first and the second switches 306 and 308 according to the duty-cycle ratio values of the cell-packs 316 and 318. For instance, the controller unit 302 can control the switching of the first switch 306 according to the duty-cycle ratio value of the cell-pack 316. Thus, the first switch 306 is switched in such a way that a discharging path is provided to the cell-pack 316 having a duty-cycle ratio value of 87.5%. Similarly, the controller unit 302 controls the switching of the second switch 308 at such a rate so as to provide a discharging path to the cell-pack 318 having a duty-cycle ratio value of 75%. At step 412, the method for managing power in an electronic device is terminated. For some embodiments, the method for managing power as described above can be overridden in cases there is a requirement for high current. In such a scenario, power from all the cell-packs of a power source can be drawn, irrespective of the method for managing power, to meet the high current requirement.

Various embodiments of the present invention offer one or more advantages. The present invention provides a method and a system for power management in an electronic device. The present invention ensures that cells of different capacity in a power source discharge at rates proportional to their capacity. In accordance with the present invention, a discharging path for each of cell-pack is provided depending upon the power capacity of the cell-pack in the power source. This ensures that all the cell-packs connected in parallel get discharged at the same rate. This prevents a situation where a cell-pack having cells of lower cell-capacity value can get discharged before a cell-pack having cells of higher cell-capacity value. Thus, although a power source can be made up of multiple cells having different power capacity, all the cells in the power source gets discharged at the same time. Further, the present invention ensures extraction of full power capacity from all the cell-packs of different power capacity of a power source.

It will be appreciated that the method and system for power management, described herein, may comprise one or more conventional processors and unique stored program instructions that control the one or more processors, to implement, in conjunction with certain non-processor circuits, some, most or all of the functions of the system described herein. The non-processor circuits may include, but are not limited to, signal drivers, clock circuits, power-source circuits and user-input devices. As such, these functions may be interpreted as steps of a method for power management. Alternatively, some or all the functions can be implemented by a state machine that has no stored program instructions, or in one or more application-specific integrated circuits (ASICs), in which each function, or some combinations of certain of the functions, are implemented as custom logic. Of course, a combination of the two approaches can also be used. Thus, methods and means for these functions have been described herein.

It is expected that one with ordinary skill, notwithstanding possibly significant effort and many design choices motivated by, for example, available time, current technology and economic considerations, when guided by the concepts and principles disclosed herein, will be readily capable of generating such software instructions, programs and ICs with minimal experimentation.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method comprising:
   determining a power source capacity value for a power source having a plurality of cells;
   determining a cell-capacity value for each cell of the plurality of cells;
   determining a duty-cycle ratio value for each cell of the plurality of cells according to the determined cell-capacity value of the cell and the power source capacity value; and
   drawing power from each cell of the plurality of cells according to the determined duty-cycle ratio value of the cell to achieve the power source capacity value for the power source.

2. The method of claim 1 further comprising determining the duty-cycle ratio value of a cell of the plurality of cells based on a function of the power source capacity value and a cell-capacity value of the cell.

3. The method of claim 2 further comprising determining the function of a cell of the plurality of cells based on a ratio of the power source capacity value and the cell-capacity value of the cell.

4. The method of claim 1, wherein drawing power from each cell of the plurality of cells comprises providing at least one of a charging path and a discharging path to a cell.

5. The method of claim 1, wherein drawing power from each cell of the plurality of cells comprises controlling a pulse-waveforms corresponding to each cell of the plurality of cells, wherein a pulse-waveform of a cell is based on a duty-cycle ratio value of the cell.

6. The method of claim 1, wherein determining the cell-capacity value comprises using at least one parameter from the group comprising a current parameter, a voltage parameter, a temperature parameter, an impedance parameter, a conductance parameter and a power parameter.

7. A system comprising:
   a power source having a plurality of cells and providing power at a power source capacity value;
   a sensing module for determining a cell-capacity value for each of the plurality of cells;
   a processor for determining a duty-cycle ratio value for each cell of the plurality of cells according to the determined cell-capacity value of the cell and the power source capacity value; and
   a controller for drawing power from each cell of the plurality of cells according to the determined duty-cycle ratio value of the cell to achieve the power source capacity value for the power source.

8. The system of claim 7, wherein the processor is further configured for determining the duty-cycle ratio value of a cell of the plurality of cells based on a function of the power source capacity and a cell-capacity value of the cell.

9. The system of claim 8, wherein the function is based on a ratio of the power source capacity and a cell-capacity value of a cell of the plurality of cells.

10. The system of claim 7, wherein the controller is further configured for providing at least one of a charging path and a discharging path to a cell.

11. The system of claim 7, wherein the controller is further configured for controlling a pulse-waveform corresponding to each of the plurality of cells, wherein a pulse-waveform of a cell is based on a duty-cycle ratio of the cell.

12. The system of claim 7, wherein the cell-capacity value is based on at least one parameter from the group comprising a current parameter, a voltage parameter, a temperature parameter, an impedance parameter, a conductance parameter and a power parameter.

13. The system of claim 7, wherein the controller is configured for controlling one or more switches.

14. The system of claim 13, wherein the one or more switches are selected from the group comprising a Field Effect Transistor (FET), a flip-flop, a Metal Oxide Semiconductor FET (MOSFET), a Bipolar Junction Transistor (BJT), an N-Channel Metal Oxide Semiconductor FET (NMOSFET), a P-Channel Metal Oxide Semiconductor FET (PMOSFET), a Complimentary Metal Oxide Semiconductor FET (CMOSFET), an electrical switch, a mechanical switch, an electro-mechanical switch, and a relay.

15. The system of claim 7, wherein the plurality of cells are inter-connected in at least one of a series connection, a parallel connection and a series-parallel connection.

* * * * *

UNITED STATES PATENT AND TRADEMARK OFFICE
CERTIFICATE OF CORRECTION

PATENT NO. : 7,977,915 B2  Page 1 of 1
APPLICATION NO. : 11/945632
DATED : July 12, 2011
INVENTOR(S) : Gilmore et al.

It is certified that error appears in the above-identified patent and that said Letters Patent is hereby corrected as shown below:

In Column 6, Line 9, delete "(700 mAH*800 mAH)" and insert -- (700 mAH÷800 mAH) --, therefor.

Signed and Sealed this
First Day of January, 2013

David J. Kappos
*Director of the United States Patent and Trademark Office*